(12) United States Patent
Smith

(10) Patent No.: US 8,179,221 B2
(45) Date of Patent: May 15, 2012

(54) HIGH Q VERTICAL RIBBON INDUCTOR ON SEMICONDUCTING SUBSTRATE

(75) Inventor: David M. Smith, Sebastian, FL (US)

(73) Assignee: Harris Corporation, Melbourne, FL (US)

( * ) Notice: Subject to any disclaimer, the term of this patent is extended or adjusted under 35 U.S.C. 154(b) by 103 days.

(21) Appl. No.: 12/783,880

(22) Filed: May 20, 2010

(65) Prior Publication Data

US 2011/0285493 A1    Nov. 24, 2011

(51) Int. Cl.
*H01F 5/00* (2006.01)
*H01F 27/28* (2006.01)

(52) U.S. Cl. ... 336/200; 336/223; 336/232; 343/700 MS

(58) Field of Classification Search .............. 336/200, 336/223, 232; 343/700 MS, 895
See application file for complete search history.

(56) References Cited

U.S. PATENT DOCUMENTS

| | | | | |
|---|---|---|---|---|
| 4,833,437 | A * | 5/1989 | Williamson | 336/192 |
| 5,206,621 | A * | 4/1993 | Yerman | 336/180 |
| 5,410,289 | A * | 4/1995 | Futa | 335/299 |
| 5,949,383 | A * | 9/1999 | Hayes et al. | 343/795 |
| 6,064,108 | A | 5/2000 | Martinez | |
| 6,111,545 | A * | 8/2000 | Saari | 343/702 |
| 6,163,300 | A * | 12/2000 | Ishikawa et al. | 343/702 |
| 6,232,925 | B1 * | 5/2001 | Fujikawa | 343/702 |
| 6,337,663 | B1 * | 1/2002 | Chi-Ming | 343/702 |
| 6,356,244 | B1 * | 3/2002 | Mizuno et al. | 343/895 |
| 6,664,026 | B2 * | 12/2003 | Nguyen et al. | 430/311 |
| 6,714,113 | B1 | 3/2004 | Abadeer et al. | |
| 6,756,708 | B2 | 6/2004 | Koeneman | |
| 6,894,646 | B2 * | 5/2005 | Washiro et al. | 343/700 MS |
| 6,972,635 | B2 | 12/2005 | McCorquodale et al. | |
| 7,035,083 | B2 | 4/2006 | Lin et al. | |
| 7,064,629 | B2 * | 6/2006 | Shoji | 333/185 |
| 7,068,139 | B2 * | 6/2006 | Harris et al. | 336/200 |
| 7,126,452 | B2 * | 10/2006 | Teshima et al. | 336/200 |
| 7,202,821 | B2 * | 4/2007 | Fujikawa et al. | 343/700 MS |
| 7,477,123 | B2 * | 1/2009 | Beerling | 336/200 |
| 7,486,237 | B2 * | 2/2009 | Huang et al. | 343/700 MS |
| 7,671,515 | B2 | 3/2010 | Metz et al. | |
| 7,675,463 | B2 * | 3/2010 | Wallace et al. | 343/700 MS |
| 2003/0122219 | A1 | 7/2003 | Park | |
| 2004/0046232 | A1 | 3/2004 | Lee et al. | |
| 2006/0203421 | A1 | 9/2006 | Morris, III et al. | |
| 2007/0256502 | A1 | 11/2007 | Aebersold et al. | |
| 2008/0055815 | A1 | 3/2008 | Rottenberg | |
| 2008/0122020 | A1 | 5/2008 | Metz et al. | |

OTHER PUBLICATIONS

Samavati, H., et al., "Fractal Capacitors", IEEE Journal of Solid-State Circuits, vol. 33, No. 12, Dec. 1998; pp. 2035-2041. Kim, K., et al., "Circuit Modeling of Interdigitated Capacitors Fabricated by High-K LTCC Sheets", ETRI Journal, vol. 28, No. 2, Apr. 2006; pp. 182-190.
Smith, D., et al., U.S. Appl. No. 12/490,605, filed Jun. 24, 2009, entitled "Inductor Structures for Integrated Circuit Devices".
Smith, D., U.S. Appl. No. 12/850,400, filed Aug. 4, 2010, entitled "Vertical Capacitors Formed on Semiconducting Substrates".
Harris Corporation, International Search Report mailed Jul. 22, 2011, Application Serial No. PCT/US2011/037263.

\* cited by examiner

*Primary Examiner* — Anh Mai
*Assistant Examiner* — Joselito Baisa
(74) *Attorney, Agent, or Firm* — Fox Rothschild, LLP; Robert J. Sacco

(57) ABSTRACT

A method of making a semiconductor device and devices thereof are provided. The semiconductor device (100) includes a semiconductor substrate (102) having opposing first and second surfaces (102a, 102b). The device further includes a planar inductor element (104) disposed on said first surface. The planar inductive element (103) comprises a free-standing electrical conductor extending along a meandering path and defining a plurality of windings (104), where the electrical conductor has a width and a height, and where a height-to-width (HW) ratio is substantially greater than 1.

18 Claims, 4 Drawing Sheets

HIGH Q VERTICAL RIBBON INDUCTOR ON SEMICONDUCTING SUBSTRATE

FIELD OF THE INVENTION

The present invention relates to inductors on semiconductor substrates and methods for forming the same, and more specifically to vertical ribbon inductors on semiconducting substrates having a high quality factor.

BACKGROUND

Conventional inductors in silicon-based integrated circuits typically have performance limits with respect to the quality factor (Q factor) and the self resonant frequency (the maximum frequency at which the inductor behaves ideally). This limited performance is principally due to the windings of the inductor lying directly on the silicon substrate or a silicon oxide layer on silicon substrate. In general, the presence of any type of dielectric layers between or beneath the windings generally results in some amount of capacitive coupling. Such capacitive coupling generally degrades the Q factor and lowers the self-resonant frequency of the inductor.

SUMMARY

Embodiments of the present invention describe methods for fabricating vertical ribbon inductors on semiconducting substrates having a high quality factor and devices therefrom. In a first embodiment of the invention, a semiconductor device is provided. The device includes a semiconductor substrate having opposing first and second surfaces, and a planar inductor element disposed on the first surface. In the device, the planar inductive element includes a freestanding electrical conductor extending along a meandering path and defining a plurality of windings, where the electrical conductor has a width and a height with a height-to-width (HW) ratio is substantially greater than 1.

In a second embodiment of the invention, a method of manufacturing a semiconductor device is provided. The method includes providing a semiconductor substrate having opposing first and second surfaces. The method further includes forming a planar inductor element on the first surface, where the planar inductive element comprises a freestanding electrical conductor extending along a meandering path and defining a plurality of windings. In the method, the electrical conductor is configured to have a width and a height, with a height-to-width (HW) ratio that is substantially greater than 1.

DETAILED DESCRIPTION

Figure 1:
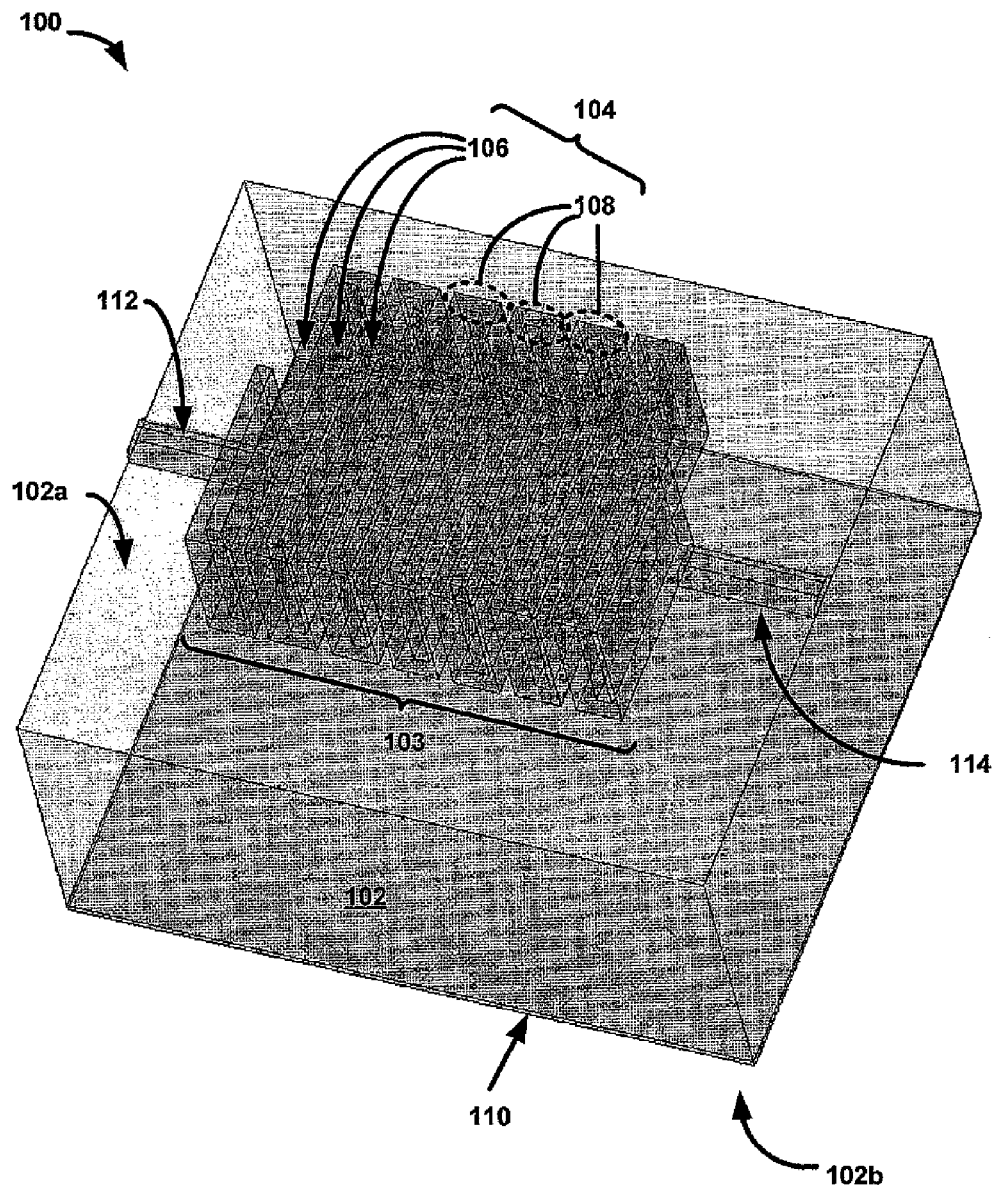
FIG. 1 is a perspective view of a portion of a semiconductor device including a vertical ribbon inductor in accordance with an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As described above, there several difficulties with incorporating inductors into integrated circuits (ICs). Further, in the case of inductors for providing values above 1 nano-Henry (nH), conventional designs for ICs are generally limited to spiral-type inductors as opposed to vertical-ribbon or serpentine inductors due to Q factor limitations. In general, both types of inductors include a series of adjacent windings through which a current flows. In the case of a spiral inductor, the currents flow in the same direction, resulting in mutual inductances that increase the overall inductance of the spiral inductor. In the case of a vertical-ribbon inductor, the currents flow in opposite directions in adjacent windings, resulting in mutual inductances that decrease the overall inductance of the vertical-ribbon inductor. Consequently, even though both types of inductors can be designed to have the same DC resistance, the enhanced inductance of the spiral inductor typically results in spiral inductors having a higher Q factor.

Unfortunately, the issue with using spiral inductors in ICs is the added complexity required for forming such inductors. In general, in order to connect the center turn to other components in an IC, a air-bridge crossover or a dielectric spaced over/underpass must be formed. Each of these structures not only adds additional steps to the fabrication process, but also introduces additional reliability concerns. In the case of an air-bridge crossover, the span required can be large, especially when the inductor has a large number of turns. As a result, such spans can be fragile, reducing the reliability of such spiral inductors in ICs. Further, for certain dimensions and materials, fabrication of an air-bridge crossover is generally non-trivial, resulting in increased manufacturing complexity and consequently driving up manufacturing costs. In the case of a dielectric spaced over/underpass, additional metallization layers can be required for the IC, at least marginally increasing costs and complexity. Further, while such structures may be less fragile and more reliable than air-bridge crossovers, such over/underpass structures are also not without issues. For example, the introduction of additional dielectric materials between the inductor windings and the over/underpass can introduce additional capacitive coupling, resulting in degradation of the Q factor and self-resonant frequency. However, despite the various difficulties with fabrication of such inductors in ICs, the typically low Q factor values for vertical-ribbon inductors have resulted in widespread use of spiral inductors in ICs.

As described above, the main limitation associated with conventional vertical-ribbon inductor structures in ICs is their inherent low Q factor values as compared to spiral-shaped inductor structures. However, the present inventor has discovered that if the surface current density in facing surfaces of adjacent windings of a vertical-ribbon inductor in an IC can be sufficiently reduced, the amount of adverse mutual inductance and capacitive coupling between the windings'can be significantly reduced. As a result of removing such effects from vertical ribbon inductors, it would be possible to increase the Q factor values and self-resonant frequency of such inductor designs. Further, the present inventor has discovered that recent advances in semiconductor fabrication techniques have enabled the formation of freestanding, electrically conductive traces with high aspect ratios (height>>width) in ICs. Accordingly, when two or more of such freestanding traces are arranged adjacent to each other and a current is directed through the traces, the surface current density in each trace will be lower as compared to what it would otherwise be in the case of conventional conductive traces in IC's having relatively low aspect ratios (height<width). In general, the current density decreases in magnitude as the height of the trace increases relative to the substrate surface.

By combining these advances in processing and discoveries, the various embodiments of the invention provide methods for fabricating high Q factor vertical-ribbon inductors in ICs and devices therefrom. More specifically, the various embodiments of the invention provide ICs having vertical-ribbon inductors using windings, formed from a single electrical trace, to reduce the current density in facing surfaces of windings in the vertical ribbon inductor. Thus, the resulting adverse mutual inductance and capacitive coupling are significantly reduced. Thus, a high Q factor value can be obtained for such inductors in an IC. In particular, the various embodiments of the invention provide ICS including inductors having windings with a HW ratio substantially greater than 1, but that still providing adequate DC resistance, high self-resonant frequencies, and high Q factor values. Such a structure is illustrated in FIGS. 1 and 2.

Figure 2:
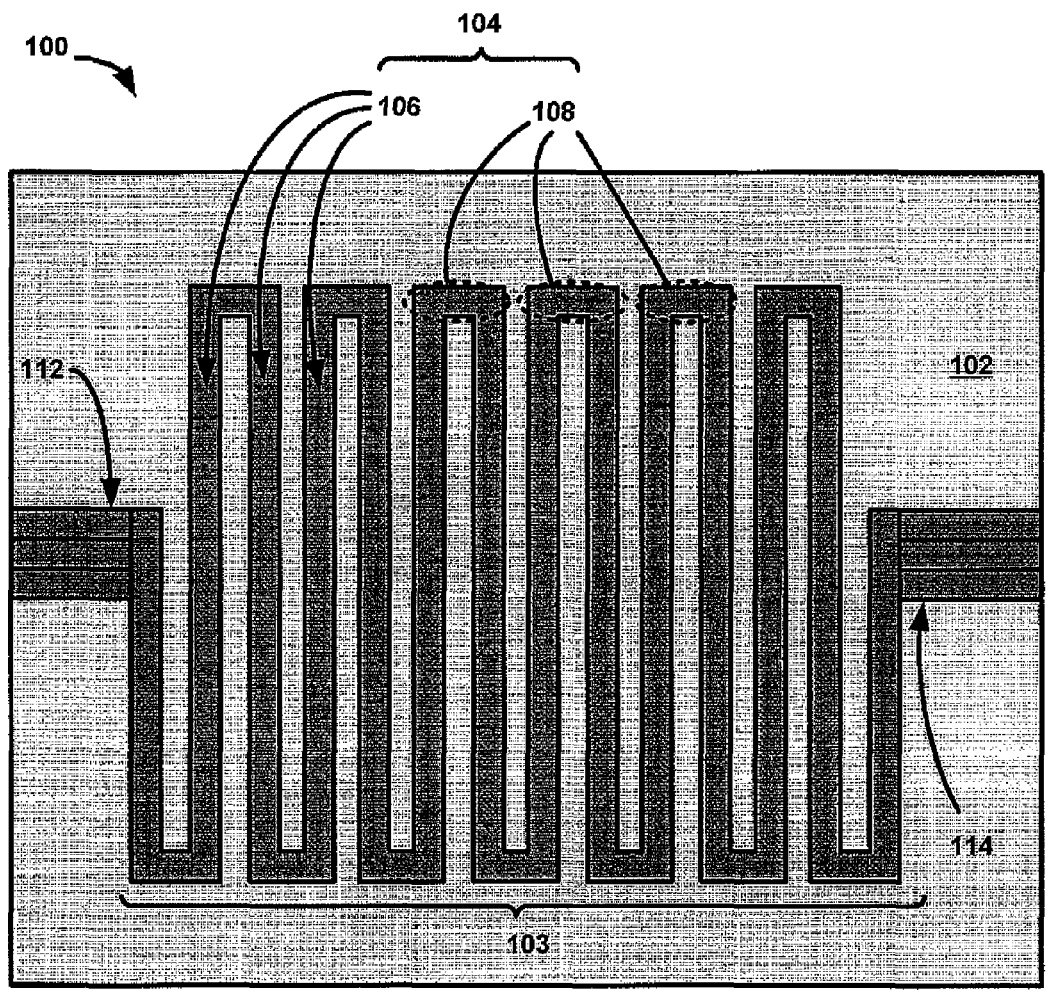
FIG. 2 is a top view of the semiconductor device of FIG. 1.

FIG. 1 is a perspective view of a portion of an IC or semiconductor device 100 including a vertical ribbon inductor in accordance with an embodiment of the invention. FIG. 2 is a top view of device 100. As shown in FIGS. 1 and 2, device 100 includes a semiconducting substrate 102 for supporting one or more semiconductor devices. For example, in one embodiment of the invention, substrate 102 comprises a silicon substrate.

The device 100 also includes at least one inductor portion 103 disposed on the upper surface 102a of substrate 102. Device 100 can also include a ground plane 110 disposed on a lower surface 102b of substrate 102 and overlapping at least the area of the upper surface 102a including inductor portion 104. Further, device 100 can include transmission lines 112 and 114 for electrical connecting first and second ends, respectively, of the inductor portion 104 to other devices and/or features of device 100. Transmission lines can be formed using conventional semiconductor fabrication techniques, but the various embodiments of the invention are not limited in this regard.

In the various embodiments of the invention, the inductor portion 103 comprises a vertical ribbon configuration comprising a plurality of windings 104. The windings 104 include a plurality of facing winding portions 106 electrically and serially coupled by a plurality of connecting winding portions 108, where the facing winding portions 106, and connecting winding portions 108 are disposed along a meandering path on the surface of substrate 102. For example, as shown in FIGS. 1 and 2, the facing winding portions 106 and connecting winding portions 108 can be disposed in a serpentine path such that the facing winding portions 106 conduct current in opposing directions. In FIGS. 1 and 2, a majority of facing winding portions 106 have a same length, width, and height. Further, an overlap and spacing between the facing winding portions 106 is also the same in FIGS. 1 and 2. However, the various embodiments are not limited in this regard. In some embodiments of the invention, the facing winding portions 106 can have different lengths, different overlaps, different spacings, or any combination thereof. Further, although inductor portion 103 is illustrated in FIGS. 1 and 2 as being solely serpentine or meandering, the various embodiments of the invention are not limited in this regard. In some embodiments of the invention at least a portion of the windings of an inductor can be partially spiral. Thus, the term "meandering", as used herein, refers any arrangement or path for an electrical conductor defining a planar inductor in which the first and last windings are located at the perimeter of the area of the planar inductor.

As shown in FIG. 1, the windings 104 of inductor portion 103 are freestanding. That is, the inductor portion 103 disposed on the surface of substrate 102 does not include dielectric materials or any other type of materials between or around a substantial portion of the windings 104 for supporting windings 104. Rather, the composition and arrangement of the electrical conductor defining windings 104 is selected to be sufficiently rigid to prevent collapse of the windings 104. More particularly, the inductor is rigidly attached to the substrate by virtue of a metallic bond, which helps prevent the windings from sagging or collapsing. Such a configuration involving a relatively large HW ratio further enhance Q factor by reducing capacitive coupling between the windings 106 and 108. Further, the electrical conductor defining windings 104 is dimensioned to provide a large HW ratio, as described above. In this respect, the electrical conductor is dimensioned such that the HW ratio is substantially greater than 1, such as 3, 5, 10, 15 or greater. For example, in one embodiment of the invention, the winding portions 106 and 108 have a width of ~5 μm and a height of ~50 μm.

As a result of the configuration in FIGS. 1 and 2 in which a large HW ratio is provided, an IC with a vertical ribbon inductor has a higher Q factor and a lower DC resistance, as compared to ICs including conventional vertical ribbon inductors having the same footprint but having a lower HW ratio. Accordingly, devices requiring inductive elements, such as radio frequency (RF) devices, can be formed with little or no increase in footprint and with a simpler and more reliable fabrication process, as compared to spiral-type inductors. Additionally, as described below, the configuration in FIGS. 1 and 2 can also result in a significant increase of the self-resonant frequency.

EXAMPLES

The following non-limiting Examples serve to illustrate selected embodiments of the invention. It will be appreciated that variations in proportions and alternatives in elements of the components shown will be apparent to those skilled in the art and are within the scope of embodiments of the present invention.

Figure 3:
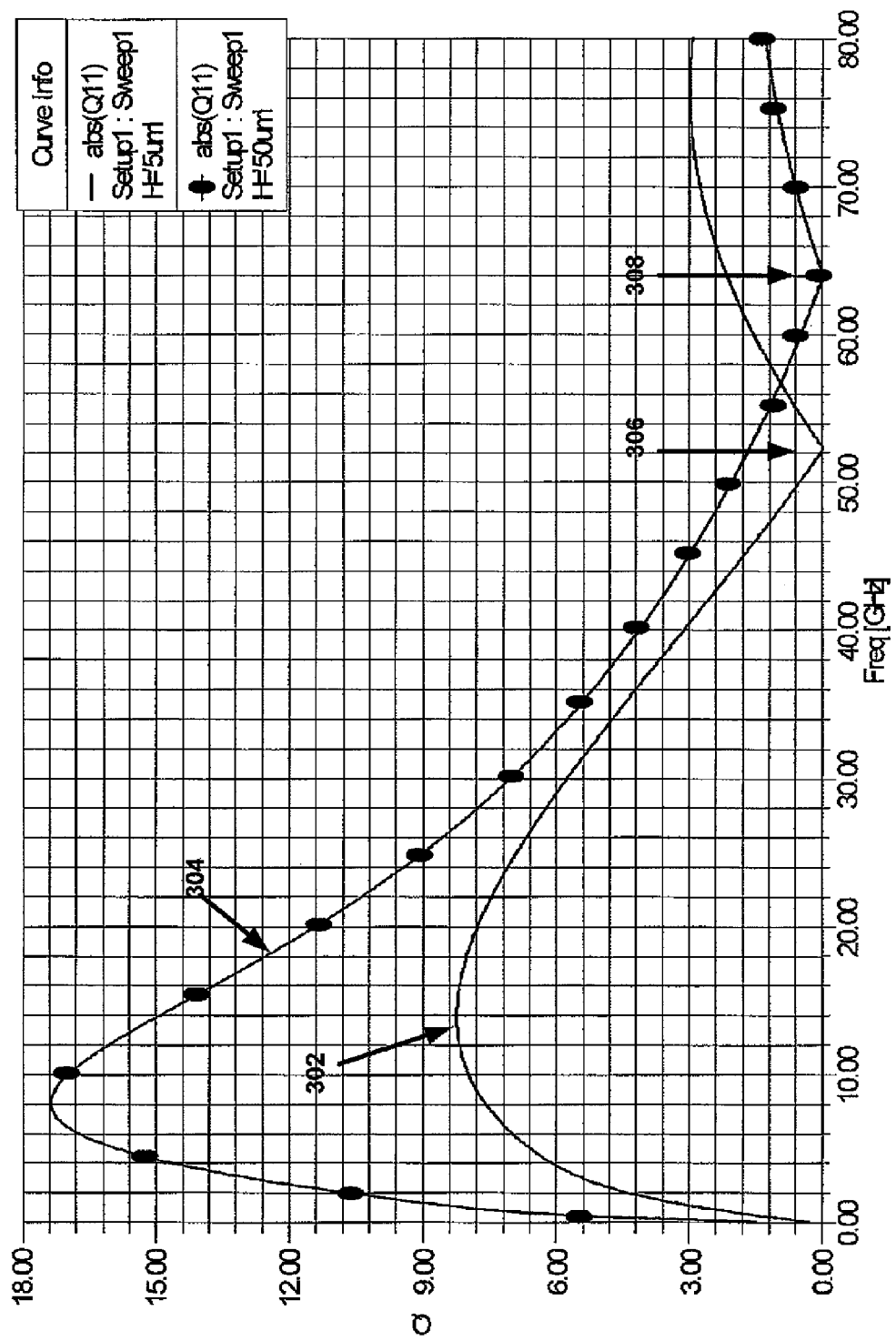
FIG. 3 is an X-Y plot showing simulated Q factor values as a function of frequency for inductors with different HW ratios that is useful for describing the various embodiments of the invention.

FIG. 3 is an X-Y plot showing simulated Q factor values as a function of frequency for inductors with different HW ratios. In FIG. 3, Q factor values are plotted as absolute values. For purposes of FIG. 3, the simulation was setup using devices similar to those shown in FIGS. 1 and 2. In particular, the substrate 102 for the simulated devices is a 100 μm (micron) thick P-type silicon substrate. Further, the windings 104 of the inductor structures 103 were defined as comprising gold electrical traces. Additionally, the transmission lines 112 and 114 and the ground plane 110 were also defined as comprising gold. Although the simulation described herein utilizes gold-comprising electrical traces and ground planes, the various embodiments of the invention are not limited in this regard. Rather, in the various embodiments of the invention, electrical traces and/or ground planes can be formed using any type of electrically conductive materials.

To provide the results shown in FIG. 3, two HW ratios for the windings 104 were simulated for a range of frequencies. For curve 302 in FIG. 3, device 100 was simulated with windings 104 having a width dimension of 5 μm, a height dimension of 5 μm (HW ratio=1), and a spacing of 5 μm between facing winding portions 106. This represents a device including a conventional configuration of a vertical ribbon inductor in which the HW ratio is ≦1. For curve 304 in FIG. 3, device 100 was simulated with windings 104 having a width dimension of 5 μm, a height dimension of 50 μm (HW ratio=10), and a spacing of 5 μm between winding portions 106. This represents a device in accordance with the various embodiments of the invention, in which the HW ratio>>1.

As shown in FIG. 3, curve 302 shows a peak Q factor value of ~8.3 at 14 GHz and a self-resonant frequency (at 306, where curve 302 factor crosses 0) of ~52 GHz. In contrast, curve 304 shows a peak Q factor value of ~17.4 at 8 GHz and a self-resonant frequency of 64 GHz (at 308, where curve 302 factor crosses 0). Thus, FIG. 3 shows that the increase in HW ratio from 1 to 10 results in approximately a two-fold increase in the peak Q factor value and approximately a 23% increase in self-resonant frequency. Further, as shown in FIG. 3, values of curve 304 are greater than the values of curve 302 across the entire frequency range simulated. Accordingly, even at frequencies away from 8 GHz, the improved inductor represented by curve 304 (HW ratio=10) still provides enhanced Q factor performance as compare to the conventional inductor represented by curve 302. Further, since the improved inductor represented by curve 304 (HW ratio=10) demonstrates a higher self-resonant frequency, the improved inductor will be operable over a wider frequency range. Thus a high Q factor value inductor can be fabricated for an IC without the need for spiral inductors and their inherent manufacturing complexities.

Figure 4:
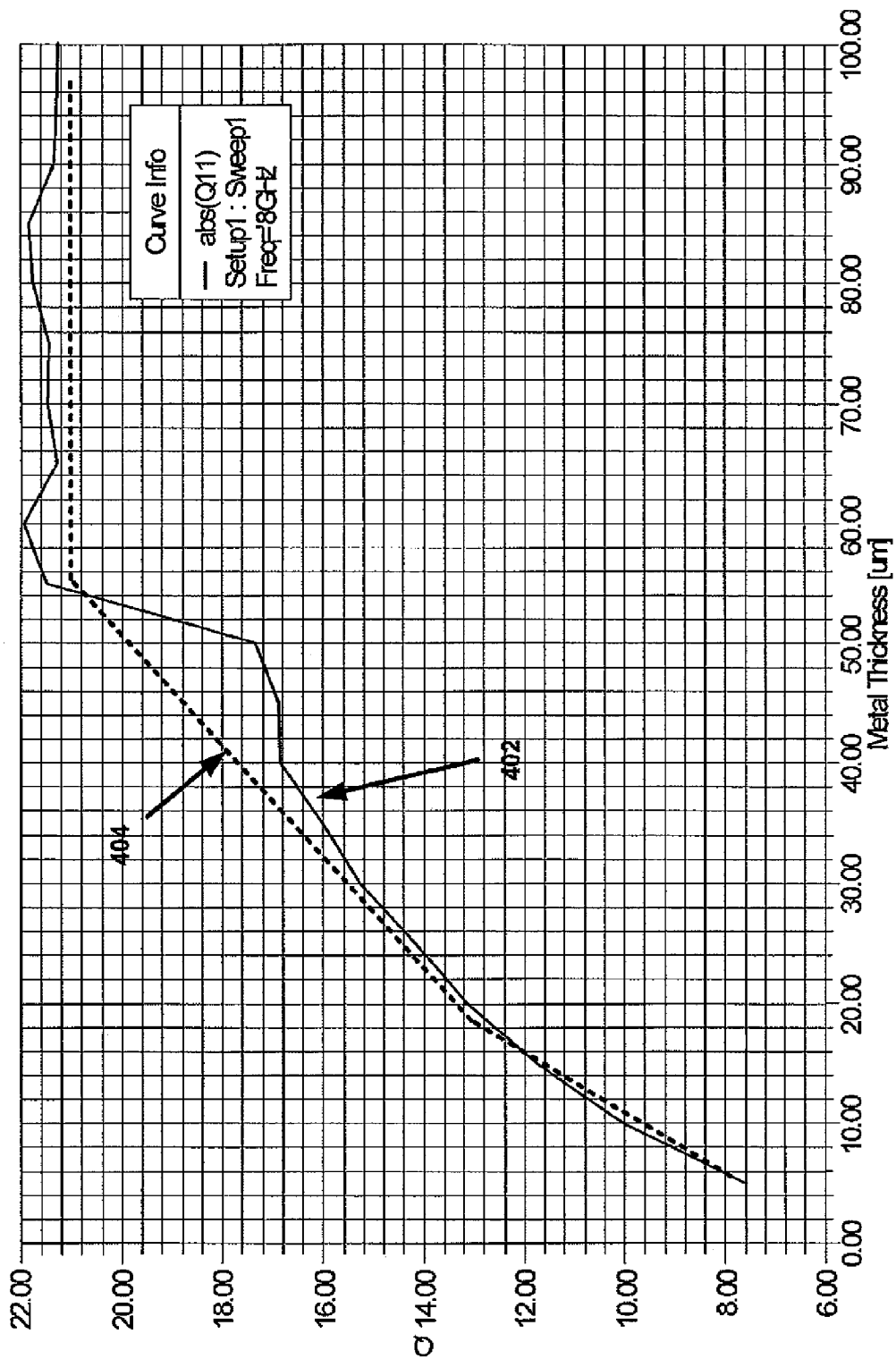
FIG. 4 is an X-Y plot of Q factor as a function of thickness that is useful for describing the various embodiments of the invention.

It is worth noting that the enhancement in Q factor as a function of HW ratio varies according to a logarithmic function. That is, the slope of the increase in Q factor as a function of HW ratio is initially large and gradually falls to zero. This is illustrated in FIG. 4. FIG. 4 is an X-Y plot of Q factor as a function of thickness. In FIG. 4, the raw data shown as curve 402 and a fit to raw data shown as curve 404) for the structure described above in FIGS. 1, 2, and 3. The fitted curve 404 is provided for illustrative purposes, as the raw data in curve 402 is believed by the present inventor to include noise due to the coarse interval (5 μm) used for the simulation. For purposes of the simulation, the frequency was fixed at 8 GHz and thickness was increased from 5 μm to 100 μm in increments of 5 μm.

As shown in FIG. 4, curves 402 and 404 show that as thickness is increased past 5 μm (HW ratio>1), a large rate of increase is initially observed in Q factor values. For example, the Q factor values increase from approximately 7.4, at a thickness of 5 μm, to approximately 13.5, at a thickness of 25 μm, a ~82% increase for a 15 μm increase in thickness. As thickness is further increased, Q factor continues to increase, albeit at a smaller rate. For example, when thickness is increased another 15 m (to 40 μm total), the Q factor value is approximately 16.8, a ~24% increase for the additional 15 μm increase in thickness and a 127% increase overall in Q factor value as compared to the 5 μm thickness. Eventually, as thickness in increased past ~55 μm, no further increase in Q factor value is observed, peaking at ~21.

The maximum Q factor value observed is due to the increase in the area of the facing surfaces of the facing windings. As known to one of ordinary skill in the art, capacitance is proportional to the area of the plates of the capacitor. In the case of device 100, the capacitance between the facing winding portions 106 (i.e., plates of the capacitor) is relatively low, partially due to the lack of a dielectric material therebetween. However, as the thickness continues to increase, the area of facing winding portions 106 (defined by the length times the thickness of facing winding portions 106) also increases. Eventually, the increase in area causes the capacitance between the facing windings 106 to increase, causing additional current paths to be formed and thus adversely affecting the inductor performance. As a result, once such capacitances become significant, further increase in Q factor is limited. In the case of device 100, this occurs when the thickness is greater than 55 μm, as shown in FIG. 4. However, in the various embodiments of the invention, the maximum Q factor value will be dependent on a number of other factors, including the spacing between facing winding portions 106, the thickness of facing winding portions 106, the composition of windings 104, substrate 102, and ground plane 110, operating frequency, to name a few. Thus, in other embodiments of the invention, the maximum value for Q factor may be larger or smaller than that show in FIG. 4.

Applicants present certain theoretical aspects above that are believed to be accurate that appear to explain observations made regarding embodiments of the invention. However, embodiments of the invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. For example, the various embodiments of the invention are not limited with regard to any particular type of semiconductor substrate or conductive materials described herein. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A semiconductor device comprising a semiconductor substrate having opposing first and second surfaces; and a vertical-ribbon inductor element disposed on said first surface, the vertical-ribbon inductive element comprising:
   a single electrical conductor formed directly on said first surface of said semiconductor substrate so as to extend along a meandering path and define a plurality of windings, said electrical conductor having a width and a height;
   wherein a height-to-width (HW) ratio of said electrical conductor is substantially greater than 1;
   wherein said plurality of windings comprise a plurality of facing winding portions serially connected by a plurality of connecting winding portions; and
   wherein heights of at least two of said plurality of facing winding portions are different.

2. The semiconductor device of claim 1, further comprising a ground plane element formed on the second surface.

3. The semiconductor device of claim 1, wherein said HW ratio is greater than or equal to 5.

4. The semiconductor device of claim 1, wherein said HW ratio is greater than or equal to 10.

5. The semiconductor device of claim 1, further comprising a transmission line formed on said first surface, and wherein at least a first end of said electrical conductor is electrically coupled to said transmission line.

6. The semiconductor device of claim 1, wherein said electrical conductor comprises a core portion comprising a first electrically conductive composition, said core portion defining a majority of said width and a majority of said height of said electrical conductor.

7. The semiconductor device of claim 1, wherein said width, a spacing, and an overlap of a majority of said facing winding portions is substantially the same.

8. The semiconductor device of claim 1, wherein first winding portions of said plurality of facing winding portions horizontally overlap each other by a first amount, and second winding portions of said plurality of facing winding portions horizontally overlap each other by a second amount that is different than said first amount.

9. The semiconductor device of claim 1, wherein said plurality of facing winding portions are substantially parallel.

10. A method of manufacturing a semiconductor device comprising:
    providing a semiconductor substrate having opposing first and second surfaces; and
    forming a vertical-ribbon inductor element directly on said first surface, wherein the vertical-ribbon inductive element comprises a single electrical conductor extending along a meandering path and defining a plurality of windings, said electrical conductor is configured to have a width and a height;
    wherein a height-to-width (HW) ratio of said electrical conductor is selected to be substantially greater than 1;
    wherein said plurality of windings comprise a plurality of facing winding portions serially connected by a plurality of connecting winding portions; and
    wherein heights of at least two of said plurality of facing winding portions are different.

11. The method of claim 10, further comprising forming a ground plane element on the second surface.

12. The method of claim 10, further comprising selecting said HW ratio to have a value which is greater than or equal to 5.

13. The method of claim 10, further comprising selecting said HW ratio to have a value which is greater than or equal to 10.

14. The method of claim 10, further comprising:
    forming a transmission line on said first surface; and
    electrically coupling at least a first end of said electrical conductor to said transmission line.

15. The method of claim 10, wherein said forming said electrical conductor further comprises:
    forming a core portion comprising a first electrically conductive composition; and
    configuring said core portion to define a majority of a width and a majority of a height of said electrical conductor.

16. The method of claim 10, wherein said width, a spacing, and an overlap of a majority of said facing winding portions are substantially the same.

17. The method of claim 10, wherein first winding portions of said plurality of facing winding portions horizontally overlap each other by a first amount and second winding portions of said plurality of facing winding portions horizontally overlap each other by a second amount that is different than said first amount.

18. The method of claim 10, wherein arranging said plurality of windings further comprises configuring said plurality of facing winding portions to be substantially parallel.

* * * * *